US006905615B2

(12) United States Patent
Fischer et al.

(10) Patent No.: US 6,905,615 B2
(45) Date of Patent: Jun. 14, 2005

(54) METHOD OF MANUFACTURING A MICROMECHANICAL COMPONENT

(75) Inventors: Frank Fischer, Gomaringen (DE); Wilhelm Frey, Palo Alto, CA (US); Udo Bischof, Wannweil (DE); Lars Metzger, Albstadt (DE)

(73) Assignee: Robert Bosch GmbH, Stuttgart (DE)

( * ) Notice: Subject to any disclaimer, the term of this patent is extended or adjusted under 35 U.S.C. 154(b) by 337 days.

(21) Appl. No.: 10/057,455

(22) Filed: Jan. 24, 2002

(65) Prior Publication Data

US 2002/0119589 A1 Aug. 29, 2002

(30) Foreign Application Priority Data

Jan. 24, 2001 (DE) .......................... 101 02 993

(51) Int. Cl.[7] .............. C23F 1/00; B44C 1/22
(52) U.S. Cl. ............................. 216/2; 216/41
(58) Field of Search .................. 216/2; 438/48, 438/50, 52; 427/154, 155, 156; 257/419

(56) References Cited

U.S. PATENT DOCUMENTS 5,985,164 A  11/1999  Chu et al.
6,287,885 B1 *  9/2001  Muto et al. ................ 438/48
6,368,885 B1 *  4/2002  Offenberg et al. ......... 438/14
6,440,766 B1 *  8/2002  Clark ......................... 438/52

FOREIGN PATENT DOCUMENTS

DE  199 39 318  2/2001
EP  0 867 702  9/1998

OTHER PUBLICATIONS

B. Li, et al., "Germanium as a Versatile Material for Low–Temperature Micromachining", Journal of Microelectromechanical Systems, IEEE Inc. New York, vol. 8, No. 4, Dec. 1999, pp. 366–372.

* cited by examiner

*Primary Examiner*—Gregory Mills
*Assistant Examiner*—Roberts Culbert
(74) *Attorney, Agent, or Firm*—Kenyon & Kenyon

(57) ABSTRACT

A method of manufacturing a micromechanical component has the steps: providing a substrate having a front side and a back side; structuring the front side of the substrate; at least partially covering the structured front side of the substrate with a protective layer containing germanium; structuring the back of the substrate; and at least partially removing the protective layer containing germanium from the structured front side of the substrate.

7 Claims, 8 Drawing Sheets

METHOD OF MANUFACTURING A MICROMECHANICAL COMPONENT

BACKGROUND INFORMATION

Although it may be applied to any micromechanical components and structures, in particular to sensors and actuators, the present invention and the underlying problem are elucidated with reference to a micromechanical yaw rate sensor or acceleration sensor having a trenched micromechanical function layer that is manufacturable using silicon surface micromachining technology.

Both surface and volume micromechanical process steps are performed with such micromechanical components. Volume micromechanical processes are used in processing the back of components. To do so, the wafer with its front side already structured is rotated and placed with this side on handler systems or instrument mounts.

There may be contamination of the front side, i.e., particles may be deposited on the structured surface. In subsequent front side etching processes, these particles can be transferred to the underlying layers. The subsequent process steps may result in freely mobile particles which impair the functioning of the respective micromechanical component.

A method has been proposed for using a temporary protective layer made of aluminum to protect the front side while processing the back. After processing the back, this protective layer is removed by a wet chemical process during which particles on the surface are underetched and lifted. However, this process is complicated and expensive, because additional process steps and mask levels are required.

SUMMARY OF THE INVENTION

The method according to the present invention for manufacturing a micromechanical component has the advantage that the germanium protective layer on the front side protects the structured layers beneath it from particles during the back process. The particles are thus deposited on the protective layer and can be removed together with the protective layer in a wet chemical etching process.

Germanium as a protective layer has the advantage that it can be deposited in a low-temperature (<450° C.) LPCVD process, so that it is compatible with aluminum. The deposition rates are about 50 nm/min. It is also possible to grow germanium selectively on silicon vs. silicon dioxide. In order to deposit germanium on oxide, a polysilicon nucleation layer is required. The germanium layer can be structured using the dry etching or plasma etching methods known in semiconductor technology. Using germanium as the protective layer for the front side of the wafer has the advantage that it can be removed after the back process by a wet chemical process using a medium containing hydrogen peroxide ($H_2O_2$). In the wet chemical process, the particles on the wafer surface are underetched and are also removed. Germanium can be removed selectively with respect to oxide, nitride, aluminum and silicon by wet chemical processes. Due to this selectivity and the low-temperature deposition process, this method is compatible with the standard CMOS processes. Since germanium is attacked by standard cleaning processes (RCA, piranha), alternative cleaning methods such as $O_2$ plasma must be used. However, it is also possible to cover the germanium layer with a CVD oxide. This oxide layer may then be removed using hydrofluoric acid at a later time, when the germanium will not be attacked. Since germanium is not attacked by KOH, it can be used as an etching mask in back processes. This permits KOH etching without an etching box.

According to a preferred embodiment, the substrate has a wafer substrate, a first sacrificial layer provided thereon and a micromechanical function layer provided thereon, the micromechanical function layer forming the front side and the wafer substrate forming the back.

According to another preferred embodiment, a first hard-surface mask is formed on the front of the substrate, and the protective layer containing germanium is formed selectively in the openings in the hard-surface mask.

According to another preferred embodiment, the protective layer containing germanium is formed over the entire surface of the back of the substrate.

According to another preferred embodiment, a first hard-surface mask is formed on the front side of the substrate, and the protective layer containing germanium is formed over the entire surface of the hard-surface mask.

According to another preferred embodiment, the protective layer containing germanium is formed over a nucleation layer covering the entire surface.

According to another preferred embodiment, a second hard-surface mask is formed on the back of the substrate, and a cavern is etched in the back with the front side covered at least partially by the protective layer containing germanium.

According to another preferred embodiment, after etching the cavern, the protective layer containing germanium is removed from the front side and then trenches are etched in the micromechanical function layer by using the first hard-surface mask.

According to another preferred embodiment, the second hard-surface mask is formed from the protective layer containing germanium on the back.

DETAILED DESCRIPTION

In the figures, the same reference symbols identify the same components or components having the same function.

FIGS. 1–6 show a schematic block diagram of the manufacturing process for a yaw rate sensor according to a first embodiment of the present invention in a cross section.

Figure 1:
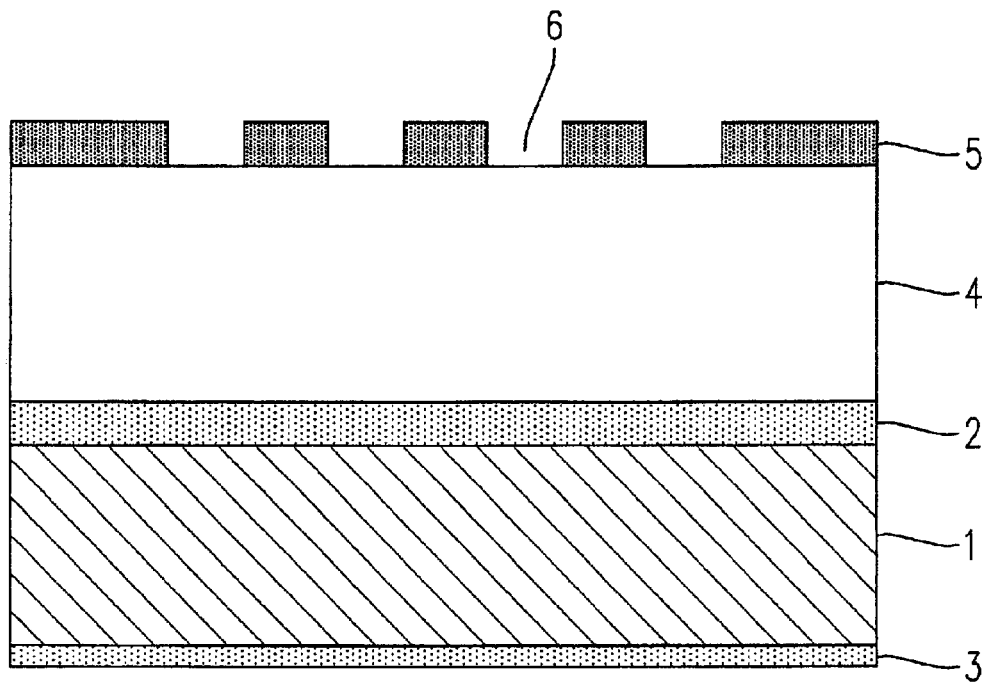
FIGS. 1–6 show schematic diagrams of the manufacturing process for a yaw rate sensor according to a first embodiment of the present invention in a cross section.

According to FIG. 1, first and second oxide layers 2, 3 are applied to the front and back sides of a base substrate 1 made of silicon. Then in a subsequent process step, a thick polycrystalline silicone layer 4 is deposited on the front side. A third oxide layer 5 is deposited on polycrystalline silicone layer 4 and is structured by a photolithographic process. Structured third oxide layer 5 functions as a hard-surface mask in a trench process carried out after the back process.

If, after structuring third oxide layer 5, the wafer were rotated for processing on the back, third oxide layer 5 could be scratched or damaged by the contact with the instrument mounts. The resulting particles could penetrate into openings 6 in structured third oxide layer 5 and stick there. In the subsequent trench process for structuring polycrystalline silicone layer 4, the particles would be transferred into openings 6 in layer 4. Freely mobile particles could be formed by subsequent process steps and could interfere with the functioning of a micromechanical component. This could be prevented by a temporary germanium protective layer 7 which is grown selectively in this embodiment.

Figure 2:
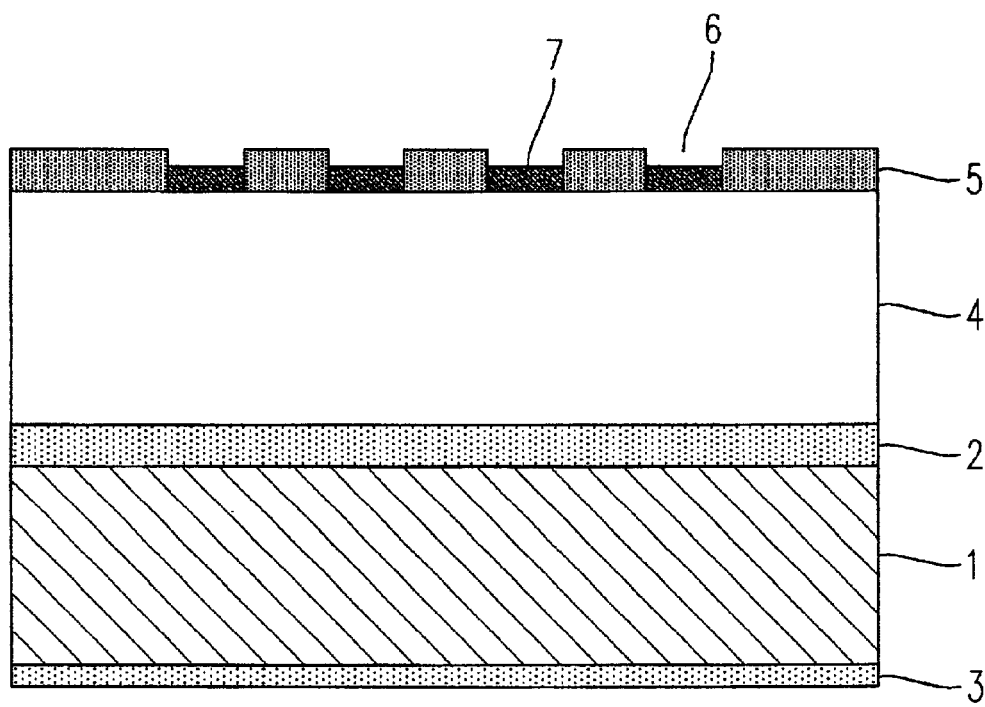

Germanium protective layer 7 is grown selectively in openings 6 in the hard-surface mask of third oxide layer 5, as shown in FIG. 2. The layer is grown in a low-temperature (<450° C.) LPCVD system. Since openings 6 are filled with germanium, no particles can be deposited in these openings. Particles on oxide mask 5 or on germanium protective layer 7 do not have any effect on the trench process. In particular, particles added during the back process on germanium protective layer 7 are also removed in subsequent removal of this layer 7 by a wet chemical method.

Figure 3:
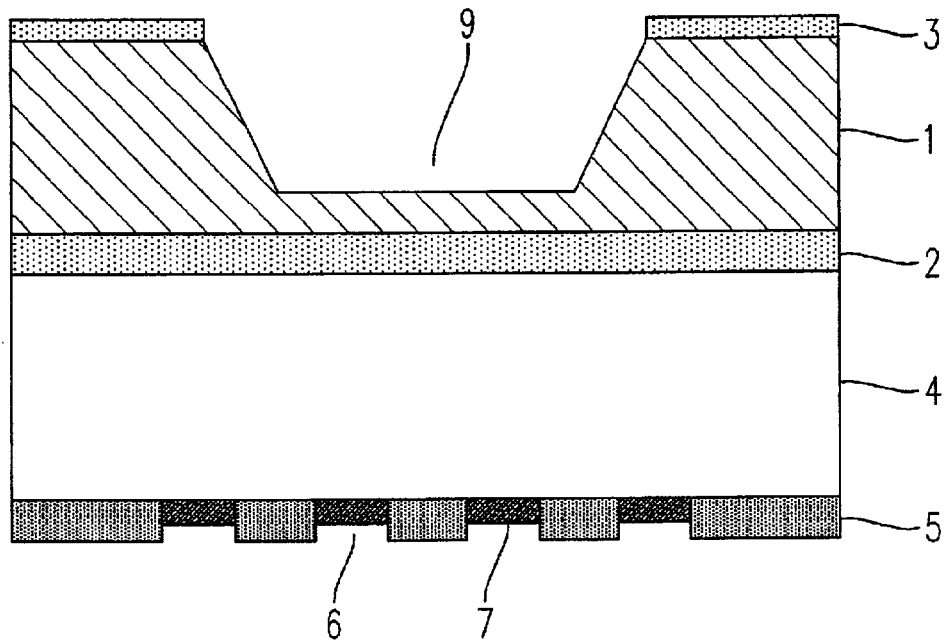

After applying germanium protective layer 7, the wafer is rotated for processing on the back, as shown in FIG. 3. A nitride layer 8 is applied to the back of the wafer. Nitride layer 8 and second oxide layer 3 beneath it are then structured. Layers 3, 8 then function as an etching mask for a subsequent KOH etching process in which, for example, a cavern 9 is etched into substrate 1 from the back. After the KOH etching, layers 3, 8 are removed and the wafer is turned again for the processes on the front.

Figure 4:
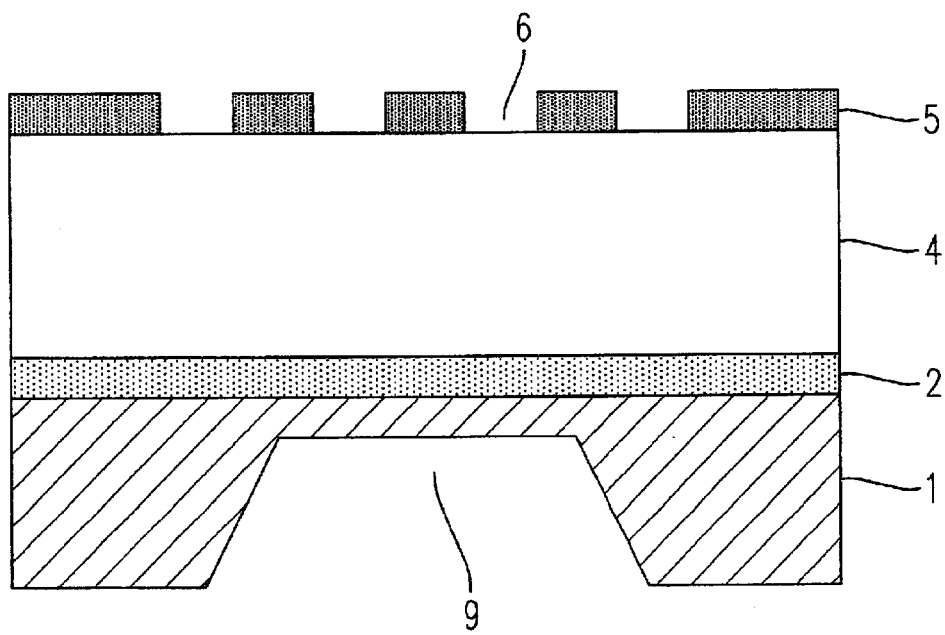

As shown in FIG. 4, germanium protective layer 7 in openings 6 is then removed in a wet chemical process with a medium containing hydrogen peroxide ($H_2O_2$).

Figure 5:
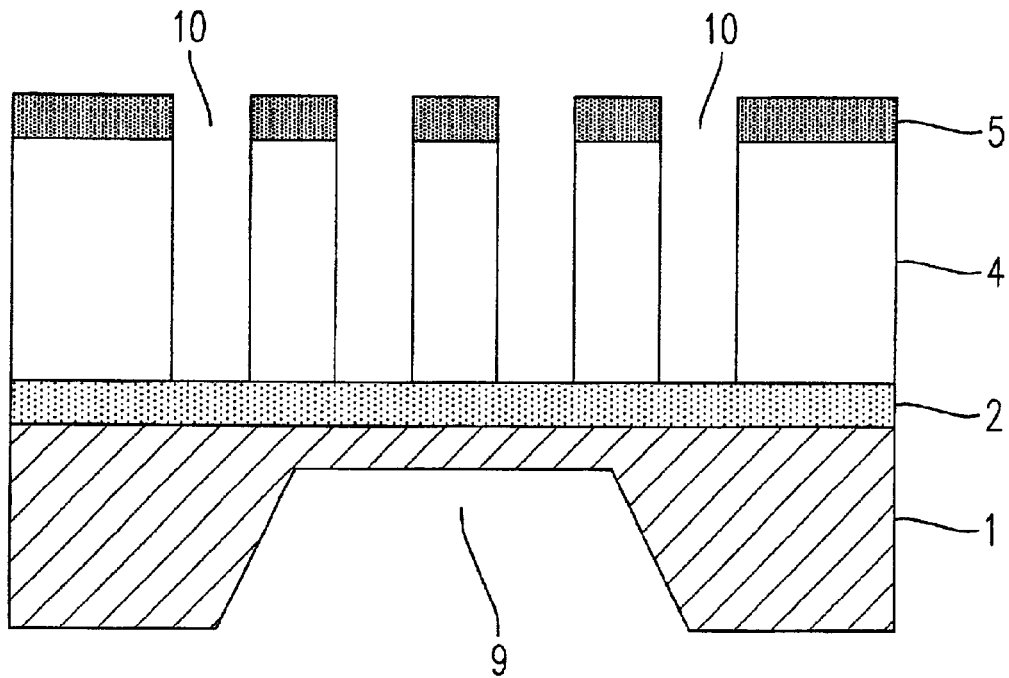

Silicon layer 4 is then structured as illustrated in FIG. 5, producing trenches 10 by the known trench process. If particles or residues were to remain in openings 6 in wet chemical etching of germanium protective layer 7, they would not have any effect on structuring of silicon layer 4, because germanium is etched with the same etching process as silicon.

Figure 6:
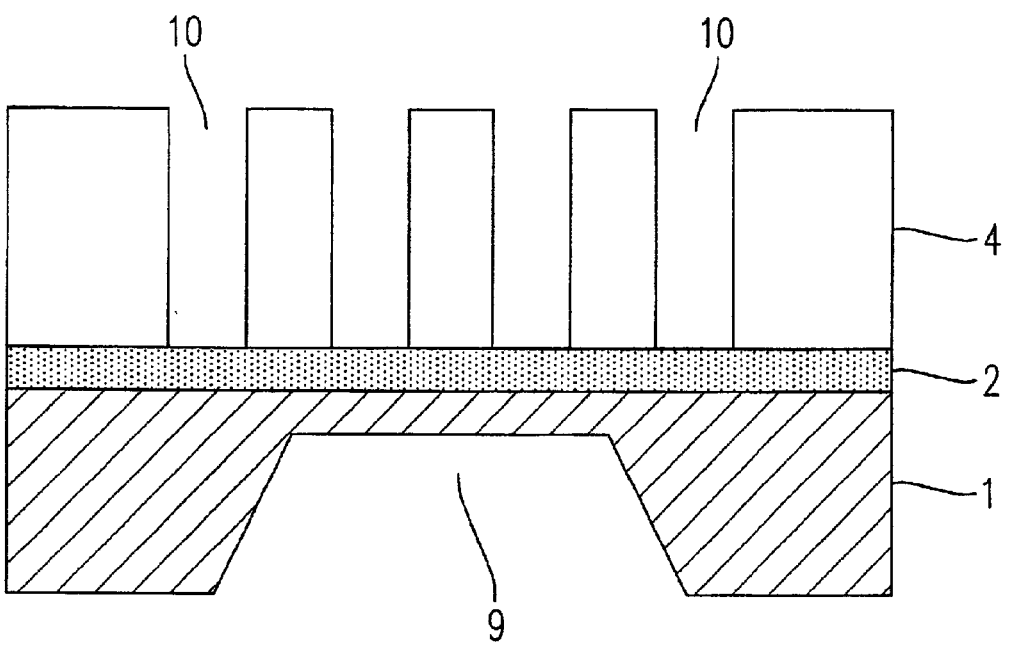

Then the hard-surface mask of third oxide layer 5 is also removed. FIG. 6 shows the wafer after the process on the front/back is concluded.

FIGS. 7–11 show a schematic cross-sectional diagram of the method of manufacturing a yaw rate sensor according to a second embodiment of the present invention.

Figure 7:
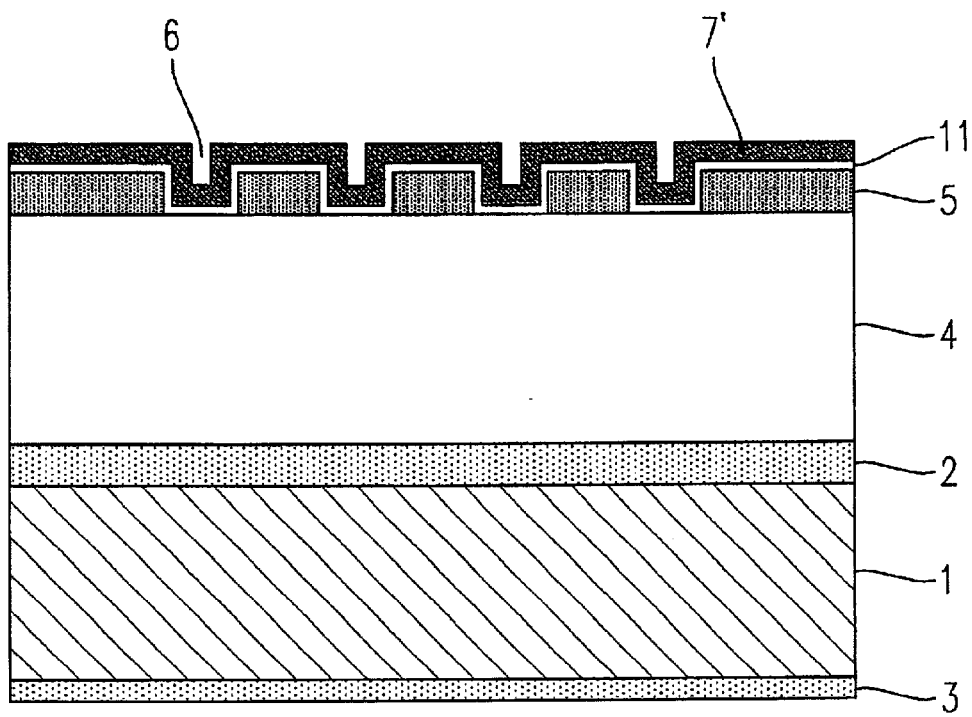
FIGS. 7–11 show schematic diagrams of the manufacturing process for a yaw rate sensor according to a second embodiment of the present invention in cross section.

In this second embodiment, germanium protective layer 7' is grown over the entire surface of the front side of the wafer with the help of a thin polycrystalline silicon nucleation layer 11, as illustrated in FIG. 7.

Structured third oxide layer 5 is completely protected by germanium protective layer 7' over the entire surface. Therefore, in processing the back, the oxide mask of third oxide layer 5 cannot be damaged, and particles may be deposited only on the surface of germanium layer 7'.

Polysilicon nucleation layer 11 is deposited on the front and back of the wafer at the same time. Nucleation layer 11 is then removed from the back of the wafer.

Figure 8:
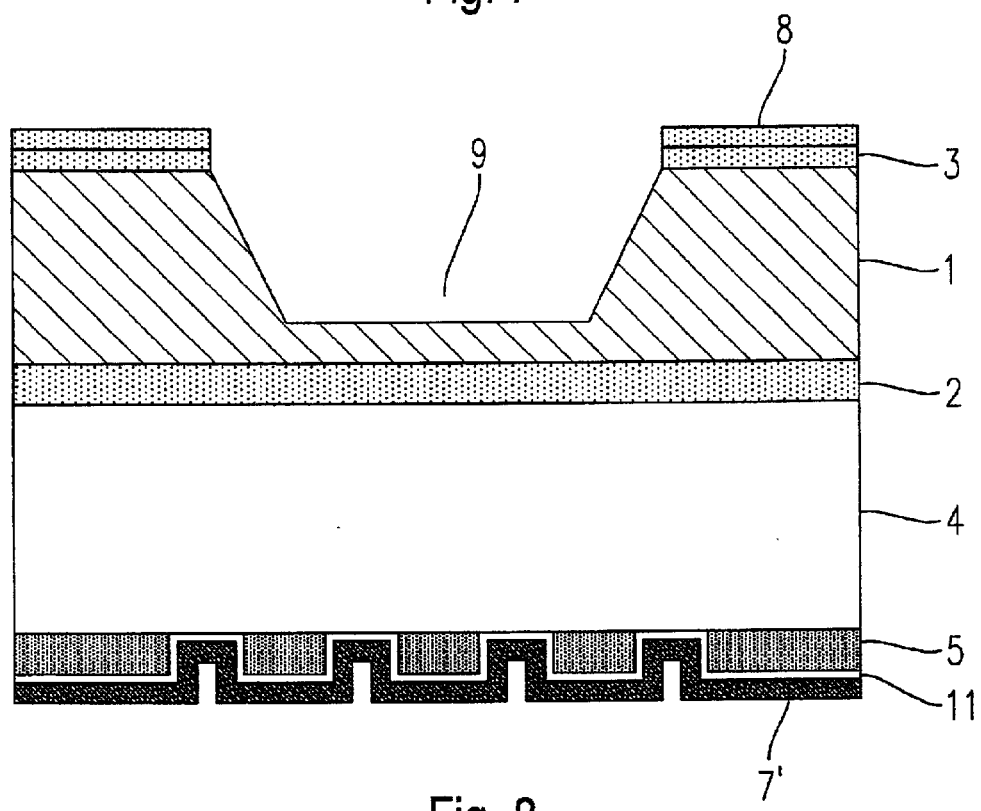

After applying germanium protective layer 7', the wafer is rotated for processing on the back, as shown in FIG. 8.

A nitride layer 8 is applied to the back of the wafer as in the first embodiment. Nitride layer 8 and third oxide layer 3 beneath it are then structured. Layers 3, 8 function as an etching mask for the subsequent KOH process in which a cavern 9, for example, is etched into substrate 1.

Figure 9:
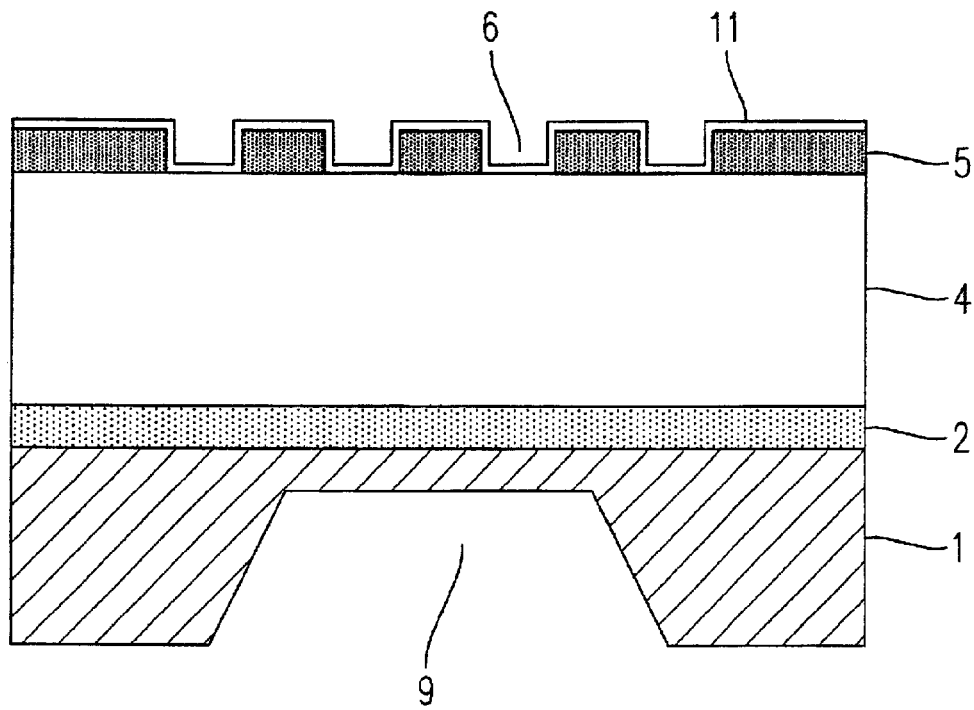
Figure 10:
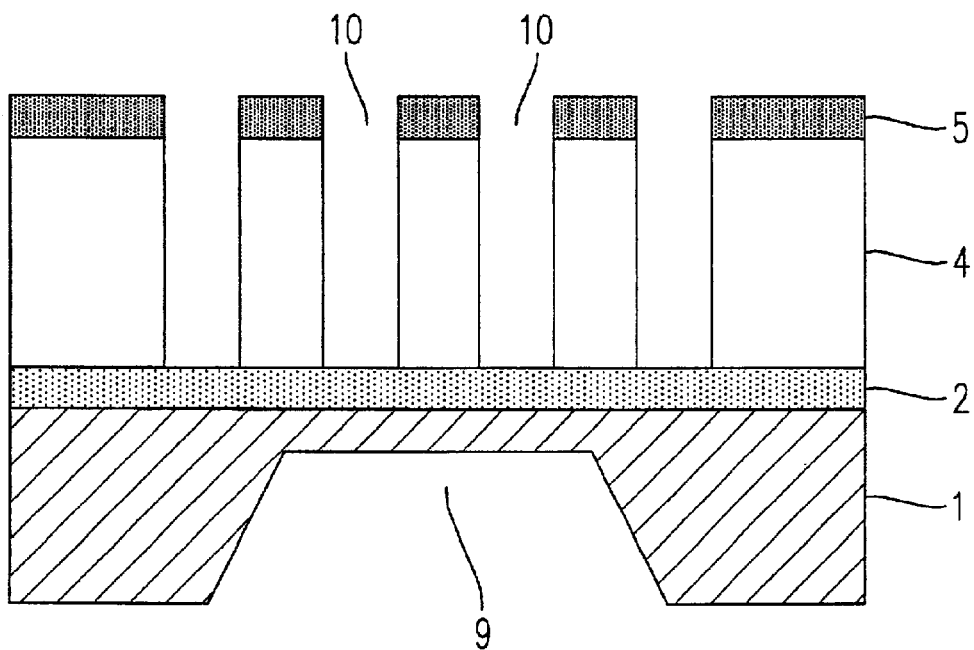

Layers 3, 8 are removed after the etching process, and the wafer is rotated for the processes on the front. As shown in FIG. 9, germanium protective layer 7' is then removed in a wet chemical process by using a medium containing hydrogen peroxide ($H_2O_2$), leaving polysilicon nucleation layer 11. This layer 11 is removed in the subsequent structuring of silicon layer 4 in which trenches 10 are produced by the trench process, as shown in FIG. 10.

Figure 11:
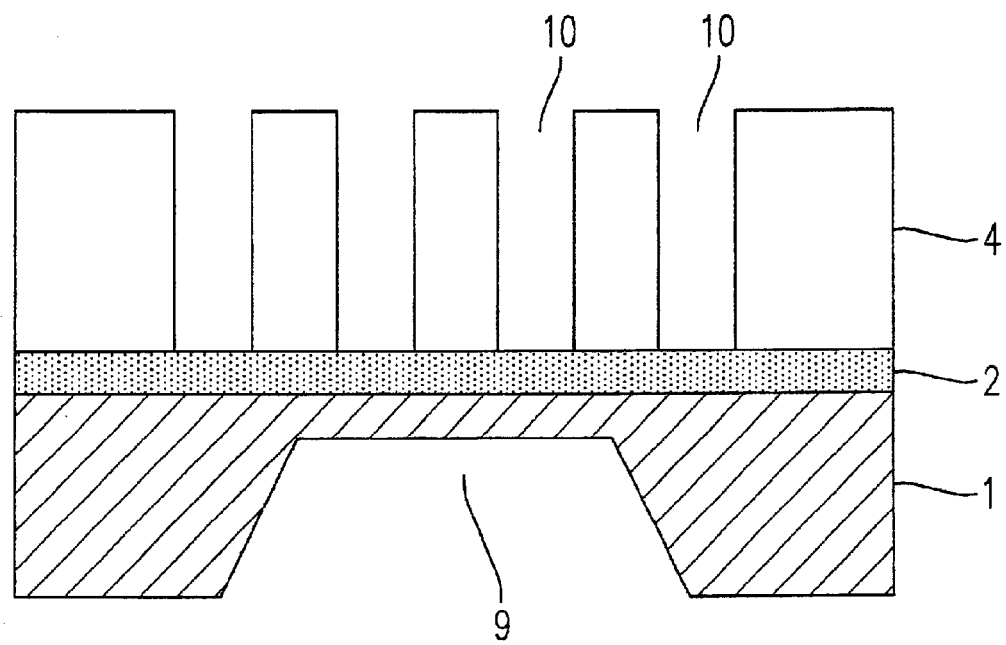
Figure 12:
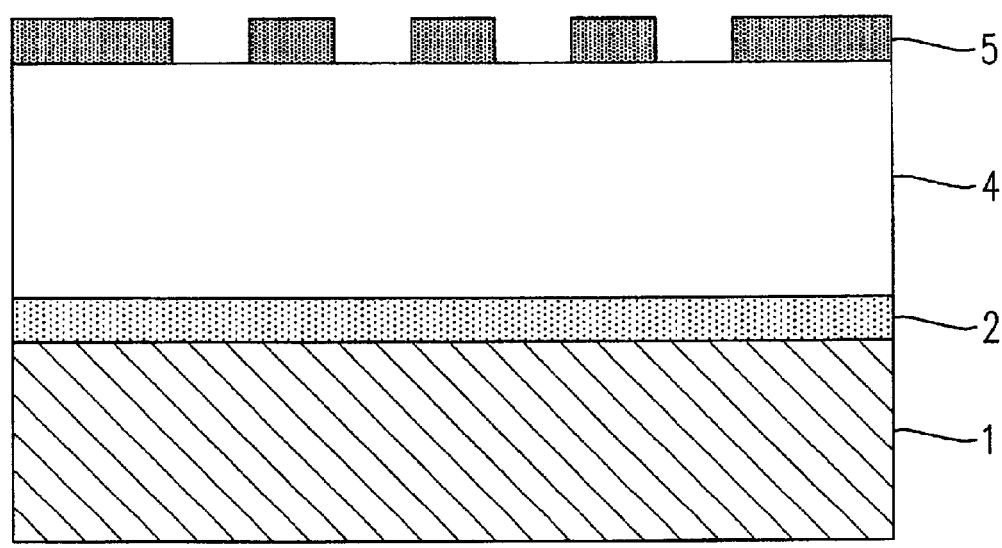
FIGS. 12–15 show schematic diagrams of the manufacturing process for a yaw rate sensor according to a third embodiment of the present invention in cross section.

Then the hard-surface mask is removed from third oxide layer 5. FIG. 11 shows the wafer after conclusion of the processing on the front/back.

FIGS. 12–15 show a schematic cross-sectional diagram of the method of manufacturing a yaw rate sensor according to a third embodiment of the present invention.

In KOH etching processes on the back, germanium may be used as the etching mask, because it is not attacked by KOH. This begins with a layered structure such as that illustrated in FIG. 12. There is a second oxide layer 3 on the back of the wafer.

Figure 13:
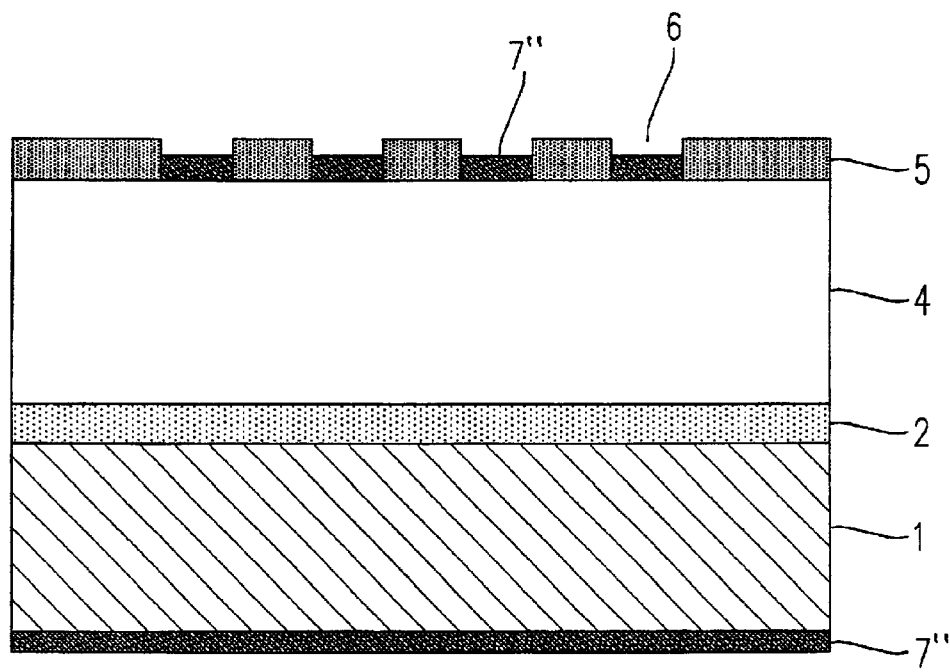

Since germanium will grow wherever silicon is present, a germanium protective layer 7" such as that illustrated in FIG. 13 is obtained on the front and back.

Figure 14:
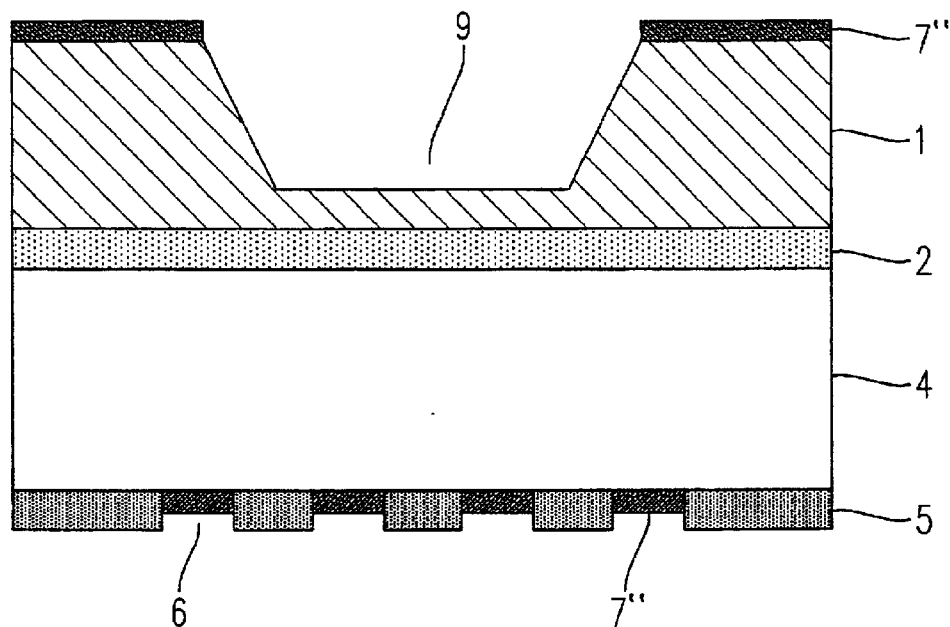

After applying germanium protective layer 7", the wafer is turned for processing on the back. Germanium protective layer 7" on the back of the wafer is then structured by a photo process and a dry etching process. Structured germanium protective layer 7" on the back then functions as an etching mask in the subsequent KOH etching process, as indicated in FIG. 14.

Figure 15:
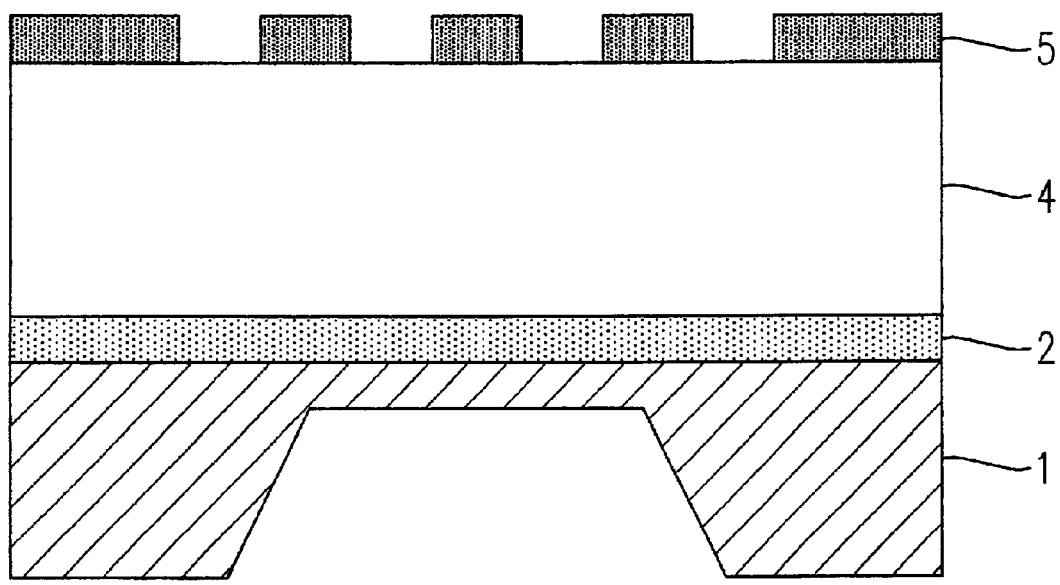

Germanium layers 7" on the front and back are then removed in a wet chemical process by using a medium containing hydrogen peroxide, as illustrated in FIG. 15. Further structuring is then performed as described above with respect to the first and second embodiments.

Although the present invention was described above on the basis of preferred embodiments, it is not limited to them but instead can be modified in a variety of ways.

In particular, the specific choices of basic materials and layer materials have been given only as examples.

What is claimed is:

1. A method of manufacturing a micromechanical component, the method comprising:
   providing a substrate having a front side and a back side;
   patterning the front side of the substrate;
   at least partially covering the patterned front side of the substrate with a protective layer containing germanium;
   patterning the back side of the substrate;
   at least partially removing the protective layer containing germanium from the patterned front side of the substrate; and
   forming a hard-surface mask on the front side of the substrate, the protective layer being formed selectively in openings in the hard-surface mask.

2. The method according to claim 1, further comprising applying the protective layer to an entire portion of the back side of the substrate.

3. A method of manufacturing a micromechanical component, the method comprising:
   providing a substrate having a front side and a back side;
   patterning the front side of the substrate;
   at least partially covering the patterned front side of the substrate with a protective layer containing germanium;
   patterning the back side of the substrate;
   at least partially removing the protective layer containing germanium from the patterned front side of the substrate;

forming a first hard-surface mask on the front side of the substrate; and forming the protective layer over an entire surface of the first hard-surface mask.

4. The method according to claim 3, further comprising forming the protective layer over an entire surface of a nucleation layer.

5. The method according to claim 3, further comprising:

forming a second hard-surface mask on the back side of the substrate; and etching a cavern into the back side when the front side is covered at least partially by the protective layer.

6. The method according to claim 5, further comprising:

after etching the cavern, removing the protective layer from the front side; and subsequently etching trenches in a micromechanical function layer via a first hard-surface mask.

7. The method according to claim 5, wherein the protective layer is also provided on the back side, and wherein the method further comprises:

patterning the protective layer on the back side to form the second hard-surface mask.

* * * * *